United States Patent
Yu et al.

(10) Patent No.: US 8,999,850 B2
(45) Date of Patent: Apr. 7, 2015

(54) METHODS AND APPARATUS FOR TMAH ETCHING

(75) Inventors: Ying Yu, Singapore (SG); Tien Choy Loh, Singapore (SG); Shian Yeu Kam, Singapore (SG)

(73) Assignee: STMicroelectronics Pte Ltd, Singapore (SG)

( * ) Notice: Subject to any disclaimer, the term of this patent is extended or adjusted under 35 U.S.C. 154(b) by 152 days.

(21) Appl. No.: 13/339,797

(22) Filed: Dec. 29, 2011

(65) Prior Publication Data

US 2013/0168355 A1    Jul. 4, 2013

(51) Int. Cl.
*H01L 21/302* (2006.01)
*H01L 21/461* (2006.01)
*C09K 13/00* (2006.01)
*H01L 21/306* (2006.01)

(52) U.S. Cl.
CPC .......... *C09K 13/00* (2013.01); *H01L 21/30608* (2013.01)

(58) Field of Classification Search
USPC ..................... 216/83; 438/705, 753
See application file for complete search history.

(56) References Cited

U.S. PATENT DOCUMENTS

| | | | | |
|---|---|---|---|---|
| 5,468,344 A | * | 11/1995 | Inoue et al. | 438/748 |
| 2003/0157809 A1 | * | 8/2003 | Geist | 438/745 |
| 2007/0037099 A1 | * | 2/2007 | Takahashi et al. | 430/311 |
| 2010/0117240 A1 | * | 5/2010 | Cichocki | 257/765 |
| 2010/0279494 A1 | * | 11/2010 | Wang et al. | 438/478 |
| 2012/0264307 A1 | * | 10/2012 | Kundalgurki et al. | 438/705 |

* cited by examiner

*Primary Examiner* — Duy Deo
*Assistant Examiner* — Mahmoud Dahimene
(74) *Attorney, Agent, or Firm* — Gardere Wynne Sewell LLP (57) ABSTRACT

Methods and apparatus for etching materials using tetramethylammonium hydroxide (TMAH) are described. The methods may involve including an additive when applying the TMAH to the material to be etched. The additive may be a gas, and in some situations may be clean dry air. The clean dry air may be provided with the TMAH to minimize or prevent the formation of hillocks in the etched structure. Apparatus for performing the methods are also described.

12 Claims, 8 Drawing Sheets

Prior Art

FIG. 1A

Prior Art

METHODS AND APPARATUS FOR TMAH ETCHING

BACKGROUND

Figure 1A:
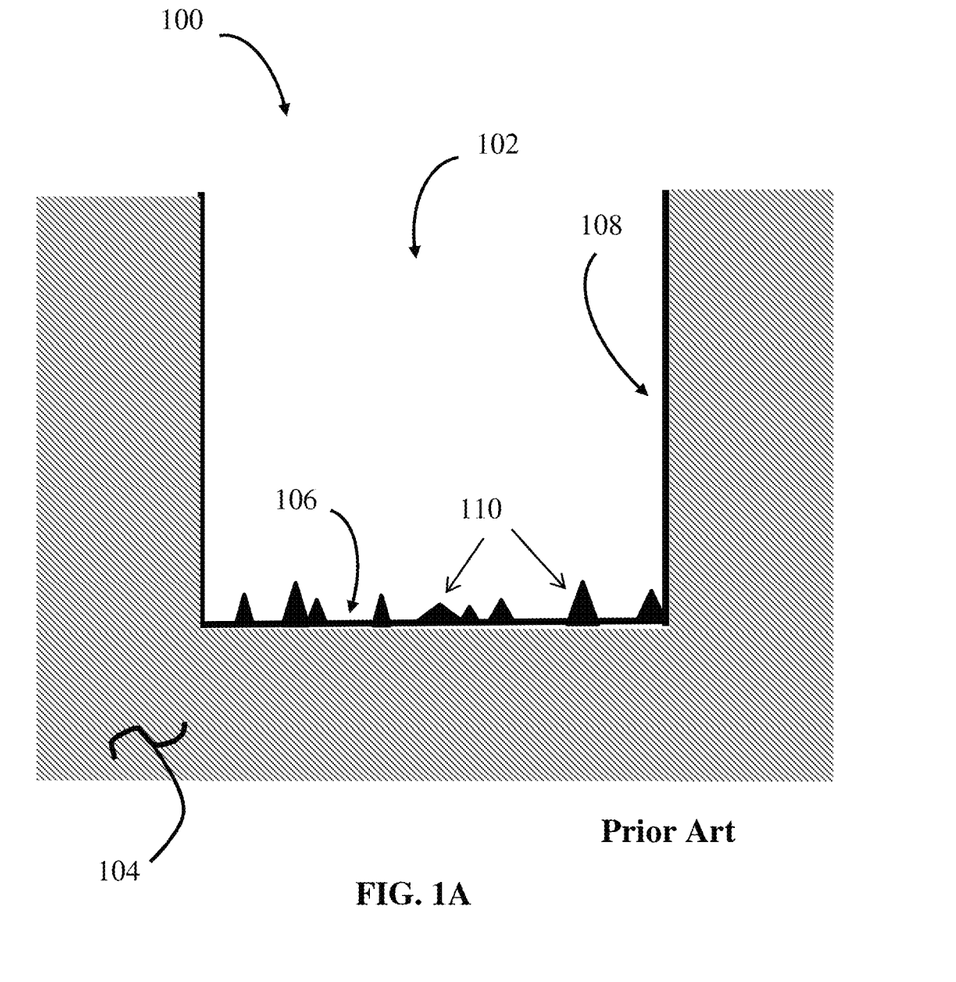
FIG. 1A illustrates a cross-section of a conventional trench in silicon including hillocks formed on the bottom surface thereof, as a result of forming the trench by etching the silicon with TMAH.
Figure 1B:
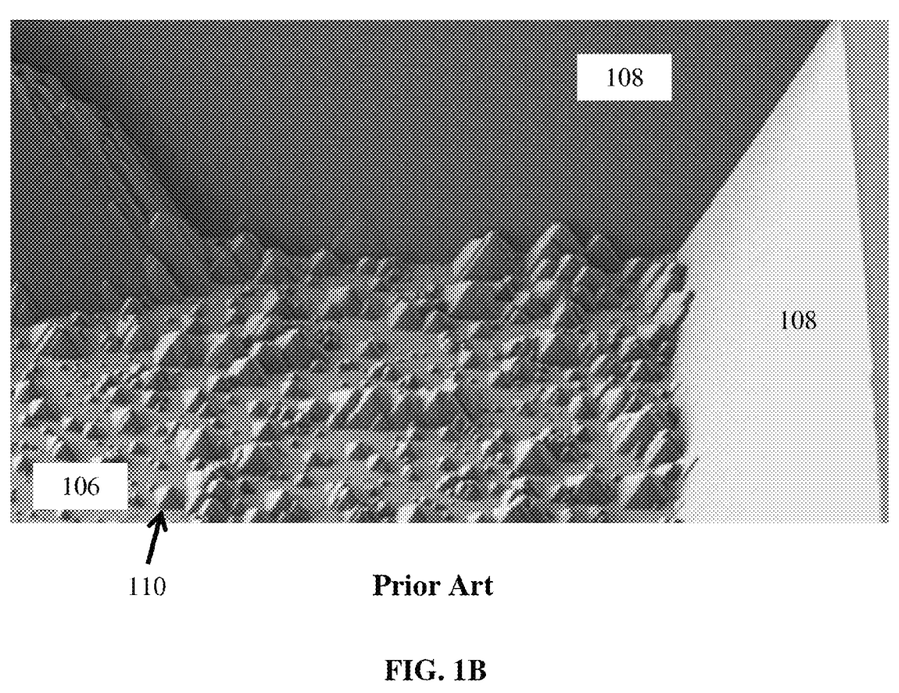
FIG. 1B illustrates a top down view of a conventional trench etched in silicon using TMAH.

Tetramethylammonium hydroxide (TMAH) is used as an etchant of silicon. When etching trenches in silicon using TMAH, hillocks are formed on the bottom and sides of the trench. FIGS. 1A and 1B illustrate such hillocks.

As shown in FIG. 1A, which is a cross-sectional view, an apparatus 100 includes a trench 102 formed in silicon 104. The trench is etched in the silicon using TMAH, and includes a bottom surface 106 and sidewalls 108. As a result of using TMAH as the etchant, hillocks 110 are formed. The hillocks are characterized by a pyramidal shape, are typically densely formed, and are of various sizes.

FIG. 1B is an image taken of a trench in silicon formed using conventional TMAH etch techniques. The top down view looks down on the bottom 106 of a trench having sidewalls 108. The hillocks 110 are visible on the bottom surface of the trench.

BRIEF SUMMARY

According to an aspect of the present application, a method is provided, comprising etching a material by applying tetramethylammonium hydroxide (TMAH) to the material during an etching period, and applying an additive to the material during at least part of the etching period.

According to another aspect, an apparatus is provided comprising an etching chamber configured to hold a material, a first source, of tetramethylammonium hydroxide (TMAH), coupled to the etching chamber and configured to supply the TMAH to the etching chamber, and a second source coupled to the etching chamber and configured to supply an additive to the etching chamber while the TMAH is supplied to the etching chamber.

BRIEF DESCRIPTION OF DRAWINGS

Various aspects and embodiments of the technology will be described with reference to the following figures. It should be appreciated that the figures are not necessarily drawn to scale. Items appearing in multiple figures are indicated by the same or similar reference number in all figures in which they appear

DETAILED DESCRIPTION

According to one aspect, a method is provided of etching a material using TMAH and without forming hillocks on the bottom and/or sidewalls of the etched structure. The method may include providing an additive while performing the TMAH etch. In one embodiment, the additive may be a gas, such as clean dry air (CDA). "Clean dry air" and "CDA" as used herein may refer to the Semiconductor Equipment and Materials International (SEMI®) standard F29 (i.e., SEMI F29). However, alternative additives may be used. The additive may be introduced simultaneously with the TMAH, according to a non-limiting embodiment.

According to another aspect, an apparatus for etching a material using TMAH and an additive is provided. The apparatus may include an etching chamber in which the material to be etched is placed. A source of TMAH may be coupled to the etching chamber and configured to introduce TMAH into the chamber to etch the material. An additive source may also be coupled to the etching chamber and configured to introduce an additive into the etching chamber during at least some of the time during which TMAH is introduced into the chamber. The additive may be a gas, such as clean dry air, and thus the additive source may be, for example, a source of clean dry air.

The aspects described above, as well as additional aspects, are described further below. These aspects may be used individually, all together, or in any combination of two or more, as the technology is not limited in this respect, unless otherwise stated.

Figure 2A:
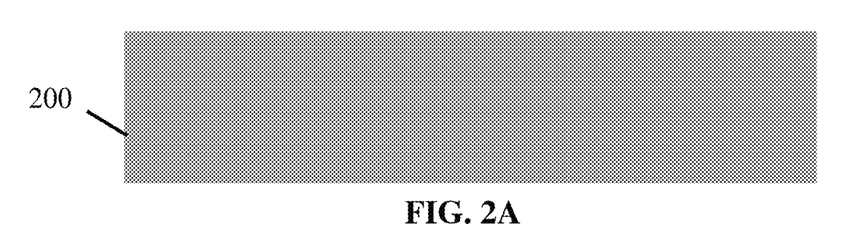
FIGS. 2A-2F illustrate, in cross-sectional form, a non-limiting example of a process flow of forming a trench in a layer of material using a TMAH etch, according to a non-limiting embodiment.
Figure 2B:
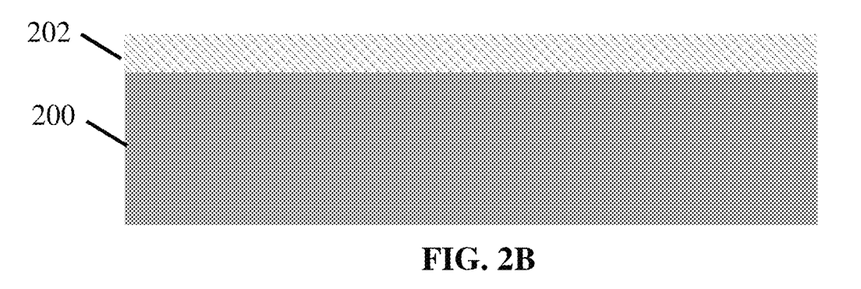

FIGS. 2A-2F illustrate, in cross-sectional form, a non-limiting example of a fabrication process to which one of more aspects of the present application may apply. Specifically, for purposes of illustration, formation of a trench in a layer of material is illustrated. FIG. 3, described together with FIGS. 2A-2F, illustrates a flow diagram of a method 300 which may be performed to create the structures of FIGS. 2A-2F.

As mentioned previously, one or more aspects of the present application may involve etching a material, such as silicon. Thus, as shown in FIG. 2A, a layer of material 200 to be etched may be provided. As a non-limiting example, the layer of material 200 may be a silicon substrate, a silicon on insulator (SOI) substrate, or any other silicon structure. In those embodiments in which silicon is used, the silicon may have any suitable crystalline structure, including being monocrystalline or having any other suitable structure.

To form the desired trench in the layer of material 200, an etch mask may be used. Assuming, as a non-limiting example, that SiO$_2$ is to be used as the etch mask, the method 300 of forming the trench in the layer 200 may begin at 302 (in FIG. 3) by forming a layer 202 of SiO$_2$ on the layer of material 200, as shown in FIG. 2B. The layer 202 of SiO$_2$ may have any suitable thickness, a non-limiting example of which is a thickness greater than approximately one micron.

Figure 2C:
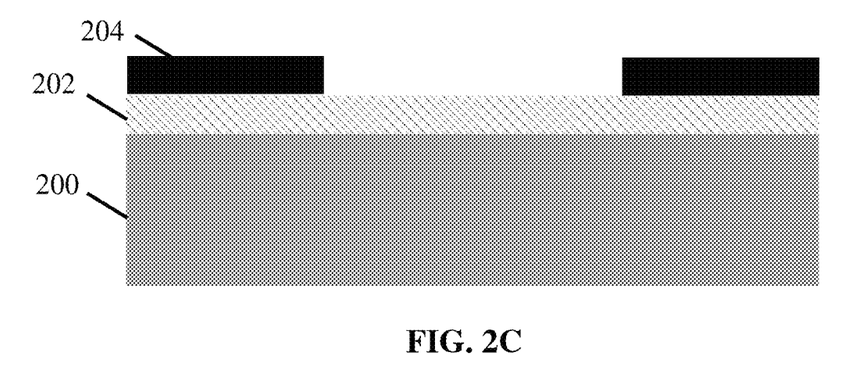
Figure 2D:
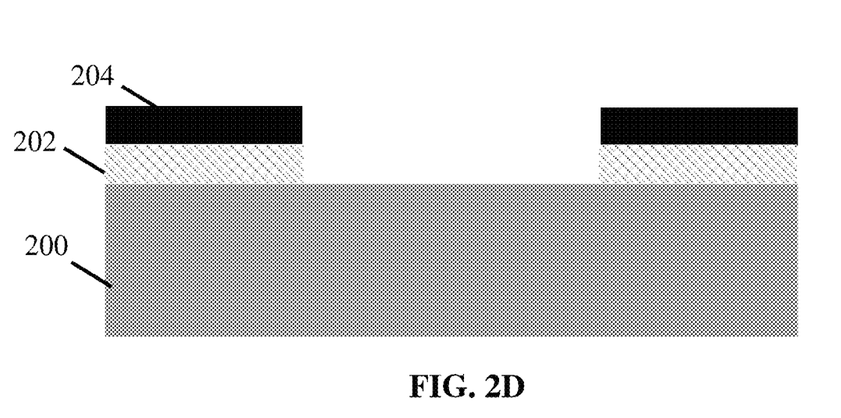
Figure 3:
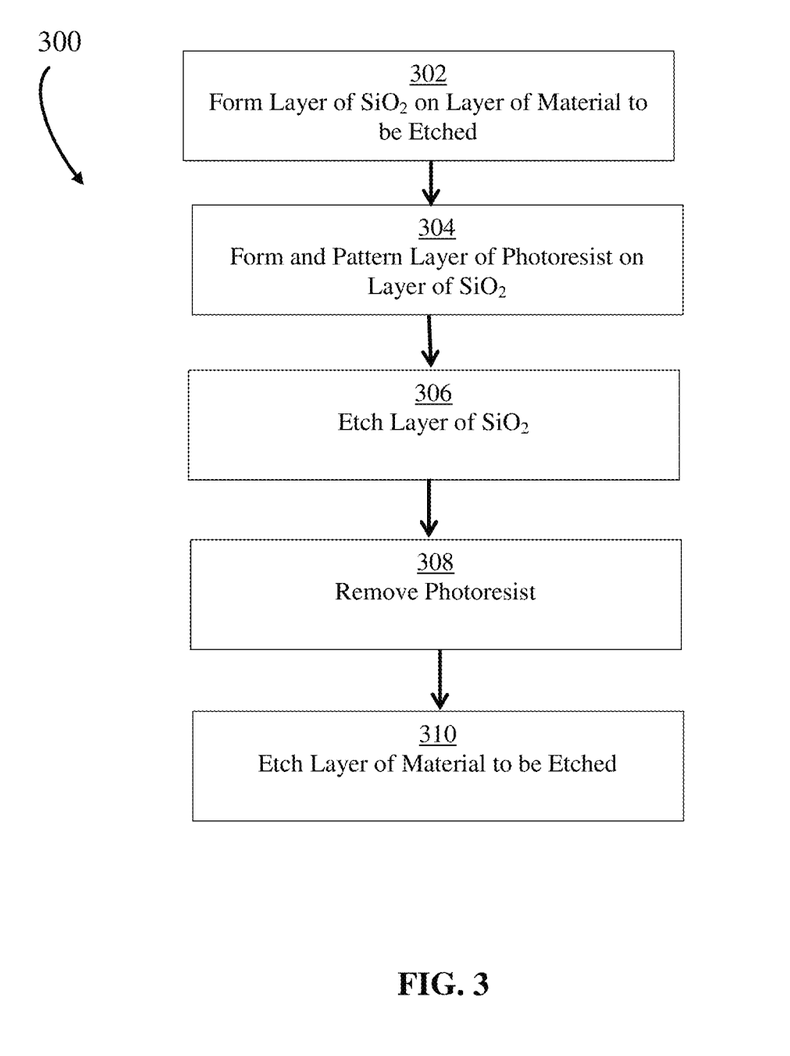
FIG. 3 is a flowchart of a non-limiting example of a methodology which may be used in the process flow of FIGS. 2A-2F.

The method may continue at 304 (in FIG. 3) with forming and patterning a layer of photoresist 204 on the layer 202 of SiO$_2$, as shown in FIG. 2C. The layer of SiO$_2$ may then be etched using the patterned photoresist layer as a mask, as shown in FIG. 2D and 306 in FIG. 3. For example, the layer 202 of SiO$_2$ may be etched with hydrofluoric acid (HF), or any other suitable etchant.

Figure 2E:
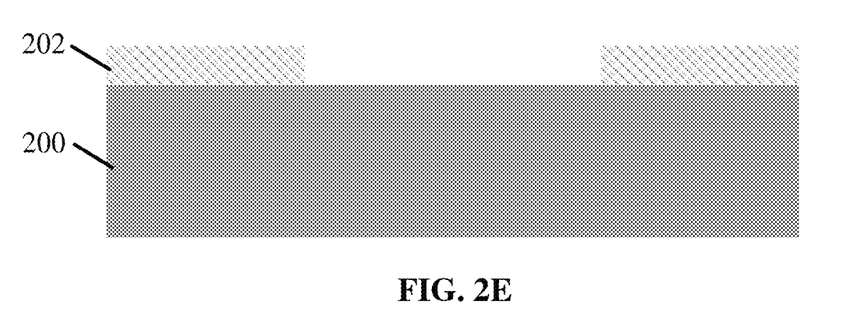

Subsequently, the remaining photoresist may be removed (or stripped), as shown in FIG. 2E and 308 in FIG. 3. The photoresist removal may be performed using a Piranna photoresist etch, or any other suitable technique. At this stage, the layer of material 200 to be etched may remain, together with a patterned layer 202 of SiO$_2$. The patterned layer 202 of SiO$_2$ may serve as an etch mask for subsequent etching of the layer 200.

Thus, the method 300 of FIG. 3 may proceed at 310 with etching of the layer 200 using the patterned layer 202 of SiO$_2$ as a mask. The result, illustrated in FIG. 2F, may be a trench 206 having a bottom surface 208 and sidewalls 210.

Figure 2F:
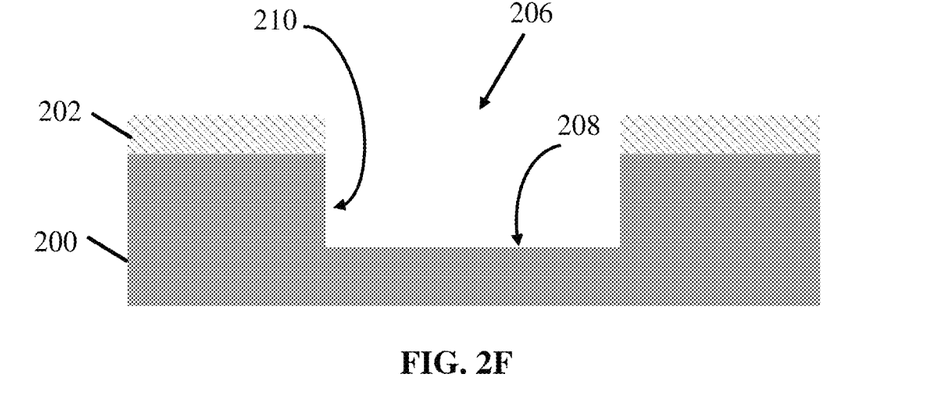

The etching of the layer 200 may involve exposing the layer 200 to TMAH. For example, the layer 200 of material may be disposed within an etching chamber, and the TMAH may be introduced into the etching chamber, or otherwise applied to the layer 200 of material. Together with the TMAH, and additive may be provided.

Applicants have appreciated that the hillocks formed using conventional TMAH etching, such as those shown in FIGS. 1A and 1B, may result from the difference in etch rate of the (101) and (100) planes of silicon using TMAH. Specifically, the etch rate of (101) planes is lower than the etch rate of (100) planes when a high amount of dissolved silicon is present. Conventionally, the lower the concentration of TMAH used, the greater the amount of dissolved silicon, and therefore the worse the hillocks are.

Thus, Applicants have appreciated that the formation of hillocks like those shown in FIGS. 1A and 1B, and accompanying conventional TMAH etches of silicon, may be reduced or eliminated (or otherwise suppressed) by introducing an oxidizing agent as an additive during the etching process. A non-limiting example of a suitable oxidizing agent is clean dry air (CDA).

Thus, according to a non-limiting embodiment, the etching of layer 200 of material using TMAH may also involve use of an additive, such as clean dry air. The clean dry air may be introduced during etching in any suitable manner.

In those embodiments in which CDA is used together with a TMAH etch of a material (e.g., a semiconductor material such as silicon), the processing parameters of the CDA may take any suitable values. For example, any suitable duration, pressure, and flow rate of CDA may be used.

As mentioned, the clean dry air can be applied to a material to be etched for any suitable duration. Assuming that the TMAH is applied for an etching period, the clean dry air may be provided together with the TMAH for at least some of the etching period (e.g., 10% of the etching period, 20% of the etching period, more than half of the etching period, etc.). Alternatively, the clean dry air may be provided together with the TMAH for substantially the entire etching period (e.g., for more than 95% of the etching period, for 100% of the etching period, or for any other suitable duration). It should be appreciated from the foregoing that in some embodiments the clean dry air (or other oxidizing additive) may be provided simultaneously with the TMAH during etching of the material (e.g., during etching of the silicon).

According to some non-limiting embodiments, TMAH etching of a material may last for more than an hour, for example between two and ten hours, between two and seven hours, between three and eight hours, between three and six hours, for approximately three hours, approximately five hours, or for any other suitable duration. Given the explanation above that CDA may be provided together with the TMAH during etching for part of all of the etching period, it should be appreciated that the CDA may be provided for any of the non-limiting times mentioned above, or for any other suitable duration.

As also mentioned above, the CDA may be applied at any suitable pressure. Non-limiting examples of suitable pressures include ten pounds per square inch (psi), five psi, fifteen psi, between approximately two psi and approximately twenty psi, less than approximately thirty psi, between approximately five and fifteen psi, or any other suitable pressure. Other pressures are also possible.

The flow rate of CDA may also assume any suitable value. Non-limiting examples of suitable flow rates include approximately fifteen cubic centimeters per minute (cc/min), approximately five cc/min, approximately twenty-five cc/min, less than approximately fifty cc/min, between approximately five and twenty-five cc/min, between approximately two and twenty cc/min, between approximately ten and twenty cc/min, or any other suitable values. Other flow rates are also possible.

Thus, by etching the layer 200 according to the aspects described above, the trench 206 may be substantially free of hillocks on the bottom surface 208 and sidewalls 210, as shown in FIG. 2F, and in contrast to the trench of FIGS. 1A and 1B. A non-limiting example of a trench formed using a TMAH etch with injection of CDA during the etch is shown in FIG. 4.

Figure 4:
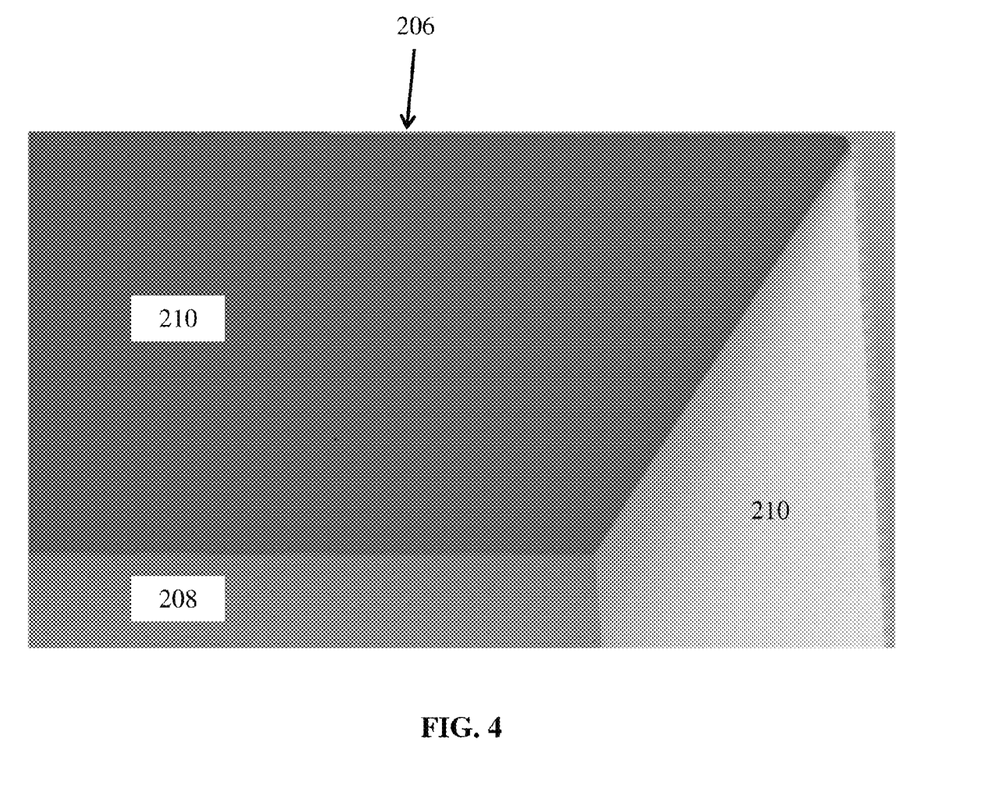
FIG. 4 is an image representing a top down view of a trench formed in silicon using a TMAH etch with clean dry air (CDA), according to a non-limiting embodiment.

As shown in the top down view of FIG. 4, which is an image of a trench formed in silicon using a TMAH etch with CDA as an additive, the trench 206 is formed with a bottom surface 208 and sidewalls 210 that are substantially free of hillocks.

According to another aspect of the present application, an apparatus suitable for performing a TMAH etch of a material using an additive, such as CDA, is provided. A non-limiting example is shown in block diagram form in FIG. 5.

Figure 5:
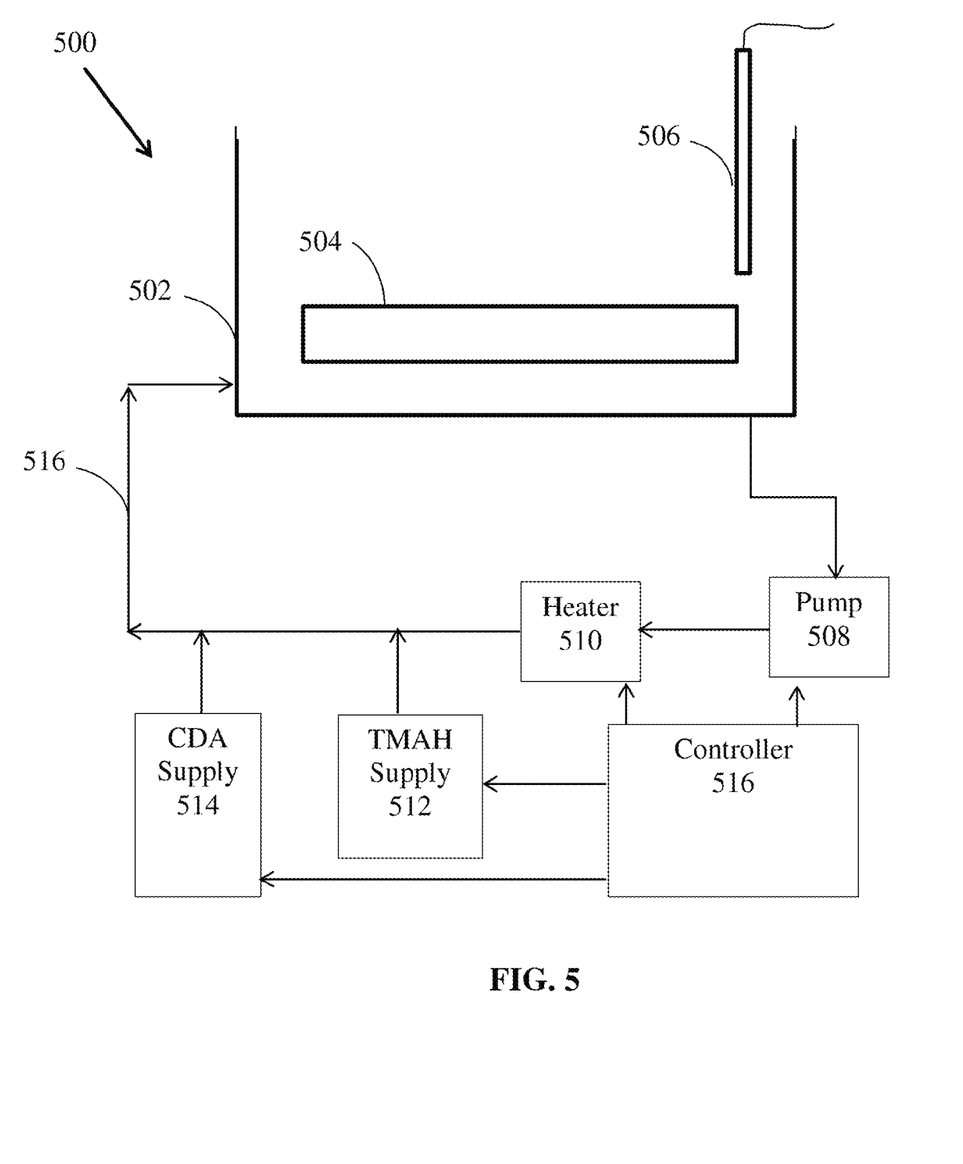
FIG. 5 is a block diagram of an apparatus which may be used to perform a TMAH etch with an additive, according to a non-limiting embodiment.

The system 500 includes an etch chamber 502 (also referred to herein as an etch tank). A sample 504 of material to be etched (e.g., a silicon substrate) is inserted or otherwise disposed in the etch chamber 502. A thermometer 506 may be included and configured to measure a temperature within the etch chamber.

The system may further comprise a pump 508, a heater 510, a TMAH supply 512, and a CDA supply 514. Various additional components may also be included, but are not shown in FIG. 5 for purposes of simplicity. For example, various valves and drains may be included. A venturi meter may also be included. Other components may also be included.

The pump 508 may generally control flow of gases into and out of the etch chamber 502. The heater 510 may control the temperature of gases flowing into the etch chamber. In some embodiments, the heater may operate in response to a temperature measured by thermometer 506 (e.g., the heater may be configured to receive a signal from the thermometer 506), though not all embodiments are limited in this respect.

As shown, the TMAH supply 512 and CDA supply 514 may be coupled to the etch chamber 502, for example via tubing (or plumbing) 516. Thus, the supplies 512 and 514 may be configured to supply their respective contents (i.e., TMAH and CDA, in this non-limiting example) to the etch chamber. Control over the timing of when TMAH and CDA are supplied may be performed in any suitable manner. For example, a controller 516 (e.g., a computer or other processor) may be coupled to one or more other components of the system and may be configured to control the timing of when TMAH and/or CDA are supplied to the etch chamber 502. As shown, for instance, the controller 516 may be coupled to the TMAH supply 512 and the CDA supply 514 to control their operation. Alternatives are also possible, as a controller need not be provided in all embodiments.

It should be appreciated that FIG. 5 illustrates a non-limiting example of a system suitable for performing TMAH etches with an additive, such as CDA. Other configurations are also possible.

While some non-limiting examples of the aspects of the present application have been described as involving the use of CDA together with TMAH to etch a material, such as silicon, it should be appreciated that CDA is a non-limiting example. As previously mentioned, in some embodiments use of an oxidizing additive (or oxidizing agent) with TMAH may be desired, such that the material being etched (e.g., silicon) may be oxidized during the etching process. Therefore, suitable oxidizing alternatives to CDA may be used in some embodiments. As a non-limiting example, oxygen gas may be used in place of CDA in the aspects and embodiments previously described. As another non-limiting example, ammonium persulfate crystals may be used instead of CDA. In such a scenario, the ammonium persulfate crystals may be manually added to the etch chamber (or etch tank) in any suitable manner. Other alternatives to CDA are also possible.

The term "approximately" has been used at various points of the present application. The context of the term provides an indication of the boundaries in each scenario. In addition, generally it should be understood that the term "approximately" may mean within 2% in some embodiments, within 5% in some embodiments, or within 10% in some embodiments. However, these are non-limiting examples.

Having thus described several aspects of at least one embodiment of the technology, it is to be appreciated that various alterations, modifications, and improvements will readily occur to those skilled in the art. Such alterations, modifications, and improvements are intended to be within the spirit and scope of the technology. Accordingly, the foregoing description and drawings provide non-limiting examples only.

What is claimed is:

1. A method, comprising:
   etching a trench in a crystalline semiconductor material disposed within an etching chamber by:
   introducing tetramethylammonium hydroxide (TMAH) into the etching chamber during an etching period;
   flowing clean dry air (CDA) into the etching chamber during at least part of the etching period;
   mixing the TMAH and CDA together in a supply line coupled to said etching chamber to form an etchant comprising a mixture of the TMAH with the CDA; and
   applying said etchant from the supply line to a surface of the crystalline semiconductor material to form said trench.

2. The method of claim 1, wherein the crystalline semiconductor material is silicon.

3. The method of claim 1, wherein flowing clean dry air into the etching chamber with the TMAH during at least part of the etching period comprises flowing the clean dry air into the etching chamber with the TMAH during substantially all of the etching period.

4. The method of claim 1, wherein flowing the clean dry air into the etching chamber with the TMAH comprises introducing the clean dry air at a flow rate of less than approximately 50 cubic centimeters per minute (cc/min).

5. The method of claim 4, wherein flowing the clean dry air comprises introducing the clean dry air at a flow rate of between approximately 5 cc/min and approximately 25 cc/min.

6. The method of claim 1, wherein flowing the clean dry air comprises introducing the clean dry air at a pressure of less than approximately 30 pounds per square inch (psi).

7. The method of claim 6, wherein flowing the clean dry air comprises introducing the clean dry air at a pressure of between approximately 5 psi and approximately 15 psi.

8. The method of claim 1, wherein the etching period has a duration of between approximately 2 hours and approximately 7 hours.

9. The method of claim 8, wherein the etching period has a duration of between approximately 3 hours and approximately 6 hours.

10. The method of claim 1, wherein the crystalline semiconductor material is silicon and the additive is clean dry air, and wherein introducing the clean dry air into the etching chamber with the TMAH during at least part of the etching period comprises introducing the clean dry air with the TMAH during substantially all of the etching period, wherein the etching period has a duration of between approximately 3 hours and approximately 6 hours, wherein introducing the clean dry air comprises introducing the clean dry air at a flow rate of between approximately 5 cubic centimeters per minute (cc/min) and approximately 25 cc/min, and wherein introducing the clean dry air comprises introducing the clean dry air at a pressure of between approximately 5 pounds per square inch (psi) and approximately 15 psi.

11. A method, comprising:
    etching a trench in a crystalline semiconductor material disposed within an etching chamber by:
    introducing tetramethylammonium hydroxide (TMAH) into the etching chamber during an etching period; and
    flowing clean dry air (CDA) into the etching chamber during at least part of the etching period; and
    combining the CDA with the TMAH in a supply line coupled to the etching chamber to form an etchant consisting essentially of TMAH with the CDA agent as an additive; and
    applying said etchant from the supply line to a surface of the crystalline semiconductor material to form said trench.

12. The method of claim 11, wherein the crystalline semiconductor material is silicon.

* * * * *